(12) United States Patent
Groves et al.

(10) Patent No.: US 6,762,479 B2
(45) Date of Patent: Jul. 13, 2004

(54) MICROWAVE ARRAY TRANSISTOR FOR LOW-NOISE AND HIGH-POWER APPLICATIONS

(75) Inventors: Robert A. Groves, Poughkeepsie, NY (US); Dale K. Jadus, Wappingers Falls, NY (US); Dominique L. Nguyen-Ngoc, Lake Peekskill, NY (US); Keith M. Walter, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/187,243

(22) Filed: Nov. 6, 1998

(65) Prior Publication Data

US 2002/0000567 A1 Jan. 3, 2002

(51) Int. Cl.[7] ............................................. H01L 27/082
(52) U.S. Cl. ...................... 257/578; 257/579; 257/580; 257/582; 257/584
(58) Field of Search ............................... 257/578, 579, 257/580, 582, 584

(56) References Cited

U.S. PATENT DOCUMENTS

| | | | | |
|---|---|---|---|---|
| 4,012,764 A | * | 3/1977 | Satonaka | ..................... 257/579 |
| 4,328,611 A | | 5/1982 | Harrington et al. | |
| 4,331,887 A | | 5/1982 | Jadus et al. | |

(List continued on next page.)

FOREIGN PATENT DOCUMENTS

| | | |
|---|---|---|
| EP | 0 071 161 A2 | 7/1982 |
| EP | 0 609 000 A2 | 1/1994 |
| EP | 0 762 511 A | 12/1997 |
| JP | 52-48366 | 4/1977 |
| JP | 56-158408 | 10/1981 |
| JP | 57-196982 | 11/1982 |
| JP | 59-086719 | 4/1984 |
| JP | 62-151757 | 9/1987 |
| JP | 01-325291 | 12/1989 |
| JP | 3-185838 A | 8/1991 |
| JP | 03-327203 | 12/1991 |
| JP | 4-79231 A | 3/1992 |
| JP | 06224214 A | 8/1994 |
| JP | 07-097783 | 3/1995 |
| JP | 07-103291 | 4/1995 |
| JP | 08-068833 | 3/1996 |

OTHER PUBLICATIONS

PCT International Search Report Oct. 27, 1999 PCT/GB 99/03552.

*Primary Examiner*—Tom Thomas
*Assistant Examiner*—Joseph Nguyen (57) ABSTRACT

A transistor array including a plurality of transistors. Each transistor includes an emitter. An emitter region contact overlies each emitter region. At least one base region underlies each emitter region and is common to a plurality of transistors in the array. At least one base contact overlies the at least one base region and is associated with each transistor. A plurality of the base contacts are common to at least two transistors in the array. At least one collector reach through is associated with each transistor. A collector reach through contact overlies each collector reach through. A buried layer subcollector region of electrically conducting material electrically connects the collector reach through region to the collector pedestal region of each transistor.

27 Claims, 5 Drawing Sheets

U.S. PATENT DOCUMENTS

| | | | |
|---|---|---|---|
| 5,099,299 A | 3/1992 | Fang | |
| 5,107,233 A | 4/1992 | Stoft | |
| 5,153,453 A | 10/1992 | Walters | |
| 5,318,916 A | 6/1994 | Enquist et al. | |
| 5,374,844 A | 12/1994 | Moyer | |
| 5,416,337 A | 5/1995 | Chang et al. | |
| 5,446,294 A | 8/1995 | Bayraktaroglu | |
| 5,455,449 A | * 10/1995 | Inn | 257/579 |
| 5,471,078 A | 11/1995 | Bayraktaroglu | |
| 5,508,552 A | 4/1996 | Iranmanesh et al. | |
| 5,554,924 A | 9/1996 | McMahon et al. | |
| 5,561,306 A | 10/1996 | Imamura et al. | |
| 5,572,063 A | 11/1996 | Iranmanesh | |
| 5,587,327 A | 12/1996 | König et al. | |
| 5,648,278 A | 7/1997 | Bayraktaroglu | |
| 5,656,514 A | 8/1997 | Ahlgren et al. | |
| 5,763,321 A | * 6/1998 | Ohshima | 438/618 |
| 5,821,148 A | 10/1998 | Leighton et al. | |
| 5,821,820 A | 10/1998 | Snider et al. | |
| 5,965,930 A | * 10/1999 | Sakamoto et al. | 257/584 |
| 6,034,413 A | * 3/2000 | Hastings et al. | 257/575 |
| 6,127,723 A | * 10/2000 | Aiello et al. | 257/582 |

* cited by examiner

MICROWAVE ARRAY TRANSISTOR FOR LOW-NOISE AND HIGH-POWER APPLICATIONS

FIELD OF THE INVENTION

The present invention relates to a transistor structure that may be arranged in an array of transistors. In particular, the present invention relates to a transistor structure that may be included in a transistor array for low noise and high power applications.

BACKGROUND OF THE INVENTION

The noise performance of bipolar devices is mainly affected by base resistance. Base resistance chiefly includes two parts. The first part of the base resistance is resistance associated with an extrinsic base region. The second type of resistance included in base resistance is resistance associated with an intrinsic, or pinched-base, region.

In modern double polysilicon self-aligned silicided base bipolar transistors, the total base resistance consists primarily of the pinched-base resistance. This is a result of the relatively low resistivity of the silicided polysilicon extrinsic base region.

The power handling capability of a bipolar device may be limited by several factors. In some applications, the ability of a device's emitter to handle a large current density may be important to creating an effective power device. In considering a device that can handle a relatively large emitter current density and still maintain peak frequency performance, one problem lies in providing a desired current to the emitter without current crowding or heating effects degrading device performance.

For a transistor with a rectangular emitter, it has been recognized that for a given emitter width, or narrowest dimension, the pinched-base resistance is minimum for a geometry that minimizes the perimeter to area ratio. The lowest perimeter to area ratio is achieved with a square emitter geometry, that is, with width equal to length. It is also known that, in order to achieve the most uniform current distribution in the emitter-base region, the smallest possible emitter dimensions are desired. In general, a small emitter also has the advantage of achieving the highest frequency performance.

Known approaches to implementing a low-noise and/or high power double polysilicon transistor is to provide long narrow emitter fingers interspersed with base contacts on either side. The low-noise advantage of providing a long narrow emitter finger is to reduce the pinched-base resistance by keeping the intrinsic base resistance essentially in a parallel configuration, along the length of the emitter. For a power device, a long narrow emitter finger provides the desired, large emitter area, and, thus, emitter current, while keeping the emitter narrow to maintain high frequency performance.

One problem with the prior art approach of using a collection of long, narrow emitter fingers is that the base resistance achieved is not minimum because the perimeter to area ratio is not minimized. Another problem is that, for a power device, current crowding and heating along the length of the emitter are problematic. Additionally, for a power device, electromigration becomes more of a concern as the emitter fingers get longer.

In a power device with many long emitter fingers, second breakdown is a major concern. Second breakdown occurs when a particular emitter finger becomes hotter than the other emitter fingers. The hotter finger begins to demand more current due to a lowered base-emitter voltage (Vbe), as a result of the increased temperature. As more current flows into the emitter finger, it becomes even hotter. Eventually the finger will go into thermal runaway and fail.

In order to control this effect, a small resistance, or emitter ballast resistor, is typically put in series with each emitter finger to provide negative feedback. This negative feedback tends to prevent thermal runaway and allows all emitter fingers to conduct an equal share of the device current. It is, however, wasteful of valuable chip space to provide a large number of emitter ballast resistors for a power device with many emitter fingers.

Therefore, a low-noise transistor needs a minimum pinched-base resistance, which is achievable with an emitter having a low perimeter to area ratio. Also desirable for either a low-noise or high-power device is to keep the emitter dimensions small in order to maximize frequency performance. For a power device, a maximum area is desired along with some means of providing an emitter ballasting function for each emitter. Power devices are also constrained by electromigration of interconnect concerns in long emitter fingers.

SUMMARY OF THE INVENTION

In providing solutions to any one or more of the above problems as well as others, aspects of the present invention provide a transistor array including a plurality of transistors. Each transistor in the array includes an emitter region. An emitter region contact overlies each emitter region. At least one base region underlies each emitter region and is common to a plurality of transistors in the array. At least one base contact overlies the at least one base region and is associated with each transistor in the array. A plurality of the base contacts are provided common to at least two transistors in the array. The array includes at least one collector reach through, or sinker, associated with each transistor. A collector reach through contact overlies each collector reach through. A buried layer subcollector region of electrically conducting material electrically connects the collector reach through region to the collector pedestal region of each transistor.

Other aspects of the present invention provide a method of forming a transistor array including a plurality of transistors. The method includes providing a substrate upon which is formed a buried layer subcollector region. A plurality of collector pedestals is provided in the buried layer subcollector region. At least one base region is provided on the collector pedestals. The base region includes an intrinsic semiconductor base region overlying each collector pedestal, and a silicided base region common to a plurality of the transistors. An emitter region is provided overlying each intrinsic base region. An emitter contact region is provided overlying each emitter region. At least one collector reach through is provided associated with each transistor. A collector reach through contact is provided overlying each collector reach through. At least one base contact is provided overlying the silicided base region and associated with each transistor, such that a plurality of the base contacts are common to at least two transistors in the array.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 4b represents a cross-sectional view through one row of the transistor array illustrated in FIGS. 3 and 4a, along the line 4b—4b in FIG. 4a.

FIG. 5b represents a cross-sectional view through a portion of one column of the transistor array illustrated in FIGS. 3, 4a, 4b, and 5a along the line 5b—5b in FIG. 5a.

DETAILED DESCRIPTION OF THE INVENTION

Figure 1:
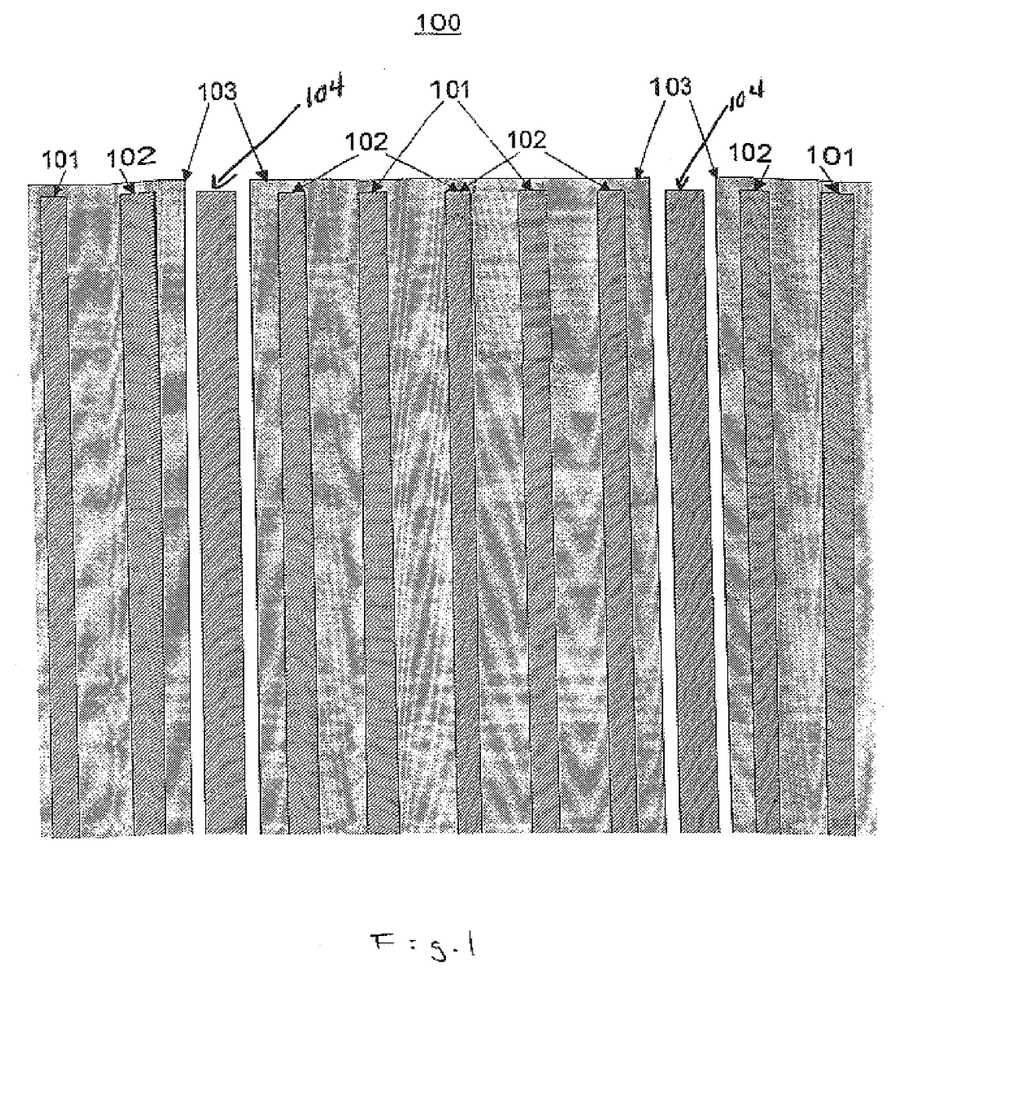
FIG. 1 represents a cross-sectional view of a known low-noise/high power transistor design.

FIG. 1 shows a cross-sectional view of a known transistor design 100. Transistor 100 includes emitter contact stripes 101 surrounded by base contact stripes 102. The extrinsic base consists of a polysilicon island 103 stretching from collector to collector 104. The emitter stripes 101 are made as narrow as possible to reduce pinched-base resistance and as long as is practical considering electromigration and heating constraints. Multiple emitter stripes 101 allow for a reduction in base resistance due to the effective paralleling of the base resistances. The emitter perimeter to area ratio is large indicating a non-optimal pinched-base resistance. The above-discussion describes in detail problems associated with such a transistor array design.

The present invention provides a new transistor design that may be arranged in an array. The present invention also includes a new method of creating an array of transistor unit cells. According to the present invention, the transistors in the array have certain portions in common. The design and method of the present invention may be optimized to achieve a desired emitter area, while keeping the emitter dimensions small.

Each transistor according to the present invention may include an emitter region. An emitter region contact overlies each emitter region. At least one base region underlies each emitter region and is common to a plurality of transistors in the array. The base may include a silicided polysilicon base that surrounds the emitter region of each transistor.

Each transistor according to the present invention also typically includes at least one base contact overlying the at least one base region. At least one base contact is associated with each transistor. However, a plurality of the base contacts are common to at least two transistors in the array.

At least one collector reach through is associated with each transistor. A collector reach through contact overlies each collector reach through. A buried layer subcollector region of electrically conducting material electrically connects the collector reach through (sinker) region to the collector pedestal region of each transistor.

The transistor design of the present invention may be arranged in an array. For example, the new design for a unit cell transistor according to the present invention can be arranged in a row column N×N matrix array. Arranging the transistors in a matrix of unit cells provides an arbitrarily large overall emitter area while maintaining small individual emitter features. This maintains the high performance characteristics of a small transistor while providing a low overall base resistance and, thus, a lower noise figure. Also, the overlapping base regions that may be included in the present invention and may be shared between and/or among transistors may help to maintain a low overall extrinsic base resistance.

Figure 2:
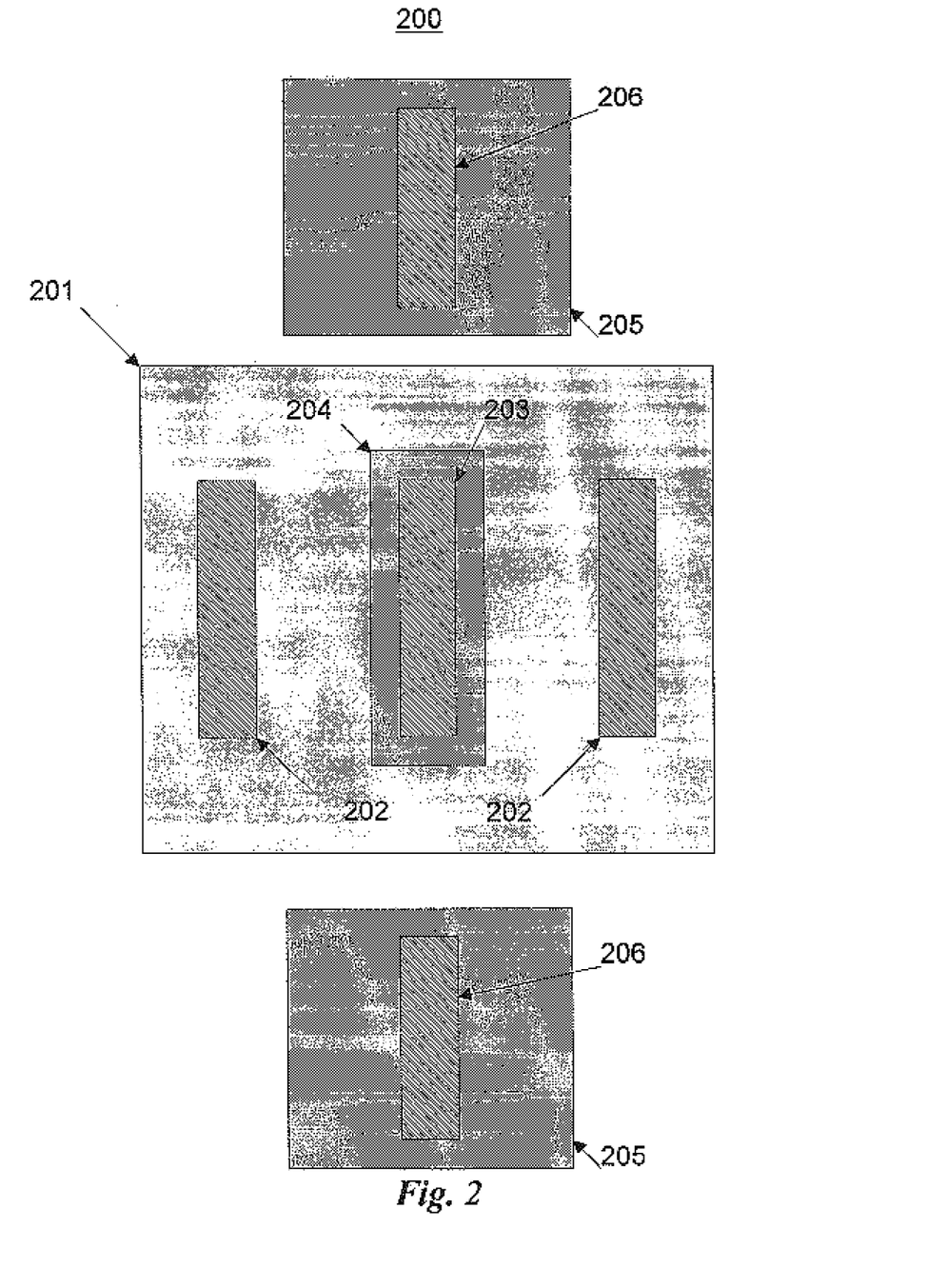
FIG. 2 represents a plan view of an embodiment of a transistor unit cell according to the present invention that may be included in an embodiment of a transistor array according to the present invention.

FIG. 2 shows a plan view of one embodiment of a transistor unit cell 200 according to the present invention. The embodiment illustrated in FIG. 2 includes an emitter 204. Typically, the emitter is made of polycrystalline silicon.

The emitter illustrated in FIG. 2 has a length-to-width aspect ratio of about 5-to-1. The aspect ratio of the emitter can be adjusted according to the design requirements, from about 1-to-1 to whatever is required, without materially changing the intent of the invention. According to the embodiment illustrated in FIG. 2, the emitter width, associated herein with the shorter dimension, was determined by the minimum achievable emitter feature size, while the length was a design decision based on the required current for the unit cell and the desired power density in the resulting array of transistors.

The size of the emitter in the unit cell can be selected to trade off the advantages of minimum size, maximum area, and minimum perimeter to area ratio. The size of the emitter may be minimized to emphasize high frequency performance of the transistor. On the other hand, the area of the emitter may be maximized to result in high power performance. Alternatively, perimeter to area ratio of the emitter may be minimized to reduce pinched base resistance.

The emitter 204 in the embodiment shown in FIG. 2 includes a single contact 203. The contact overlies the emitter. The contact is made of electrically conducting material. As described below, certain materials may be included in the contact which may have some significance in the operation of the invention.

The base of the transistors of the present invention may include an intrinsic portion and an extrinsic portion. Both portions may be made of the same or different materials. As stated above, at least some portions of the base may be common to a plurality of the transistors in the array. For example, the extrinsic base polysilicon for a row of unit cells may be a common silicided polysilicon plate. The silicided polysilicon extrinsic base regions overlap between unit cells. The polysilicon base regions nay have a low sheet resistance. This may help to maintain a low overall extrinsic base resistance.

A transistor array according to the present invention may include a plurality of base regions common to a plurality of transistors in the array. Each base region may be common to a different set of transistors. Such common base regions typically are formed of polycrystalline silicon. The silicided polysilicon base may provide an electrically conducting contact on both sides of the emitter's longest dimension, referred to herein as the emitter's length.

In the embodiment represented in FIG. 2, the emitter 204 is surrounded by an island of silicided polysilicon extrinsic base 201. This base polysilicon is contacted on either side of the emitter with contacts 202 of electrically conducting material, such as metal.

At either end of the emitter 204, adjacent the shorter dimension of the emitter, are located collector reach through 205. The collector reach throughs or sinkers 205 may be formed of a highly doped material of similar type to that used in the buried layer subcollector. The doping may be such that the collector reach throughs (sinkers) provide an ohmic contact to the buried layer subcollector. The transistor may include contacts 206 of electrically conducting material, such as at least one metal.

The unit cell 200 transistor according to the present invention may be laid out such that when it is replicated in a row, the base contacts 202 will overlap. Such an arrangement may also permit overlap of the silicided extrinsic base polysilicon 201. This may provide for a uniform distribution of current into the base on either side of the emitter 204.

Figure 3:
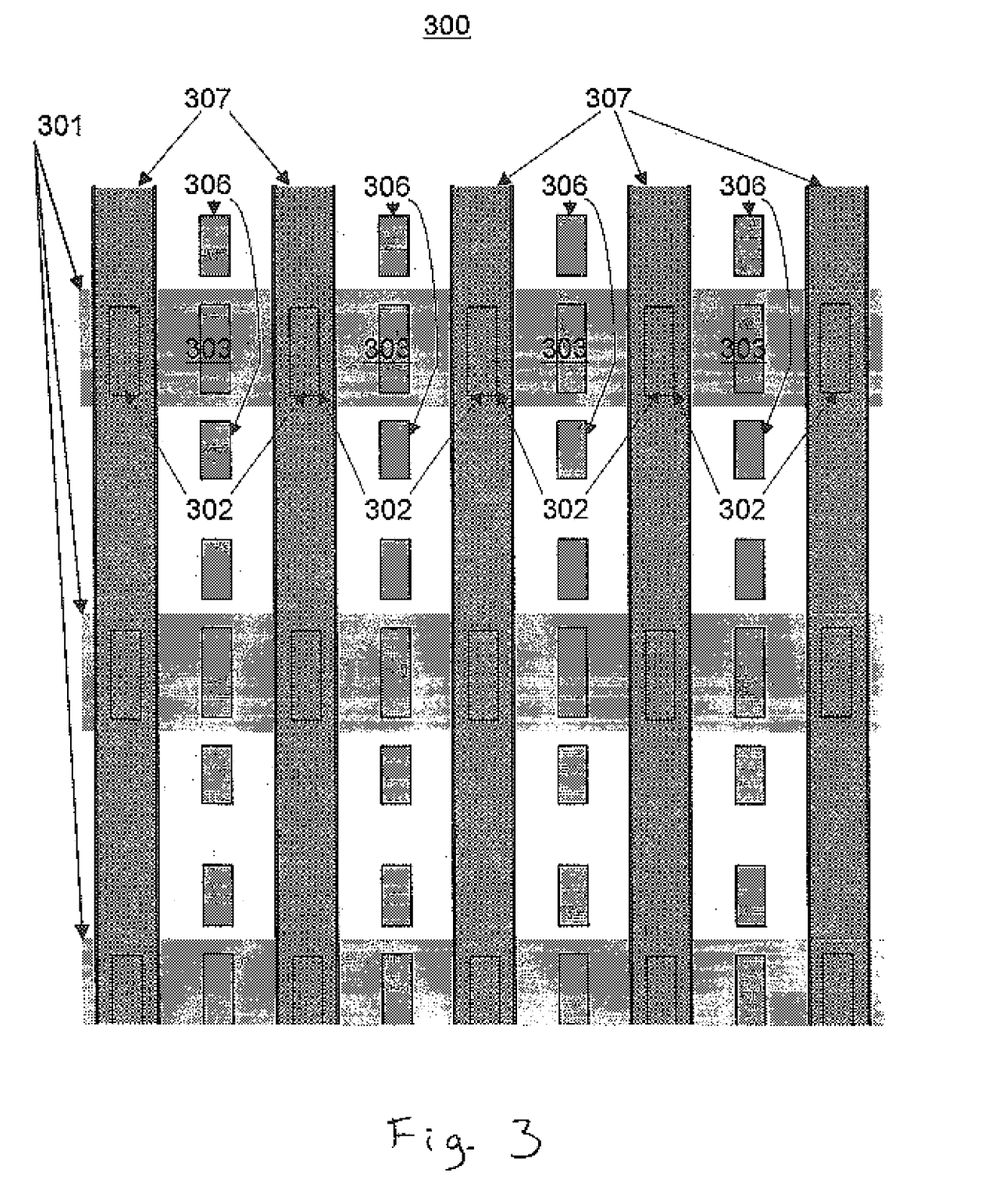
FIG. 3 represents a plan view of an embodiment of a transistor array according to the present invention that includes a three row by four column matrix.

As stated above, the transistor design according to the present invention may be arranged in an array. Typically, the array includes an N×N row-column matrix of transistors. FIG. 3 provides a plan view of an example of an embodiment of a three row by four column array of unit cells 300 according to the present invention. The dimensions of the array can be varied from a single unit cell to an N×N matrix without materially changing the intent of the invention.

For each row of the array illustrated in FIG. 3, the polysilicon base region 301 is provided in one intact piece. Each of these base regions provides a conductive path for base current from the base contacts 302 to the emitter region 303.

The rows of polysilicon base regions 301 may be electrically joined together by base contact interconnects of electrically conductive material. Typically, the base contact interconnects are stripes of first metal (M1) 307. These M1 base contact interconnect stripes 307 may run the entire length of the column and are repeated on each side of the emitter 303. Thus, the base contact interconnects may electrically join all base contacts 302. Each base contact interconnect may join a different set of base contacts.

The base contact interconnect stripes 307 may be joined at the top and/or bottom of the array to provide an M1 connection between them. Along these lines, the present invention may include at least one region of electrically conductive material electrically connecting together the plurality of base contact interconnects. The interconnection levels required to contact the emitter and collector are not shown in FIG. 3 for clarity.

Figure 4A:
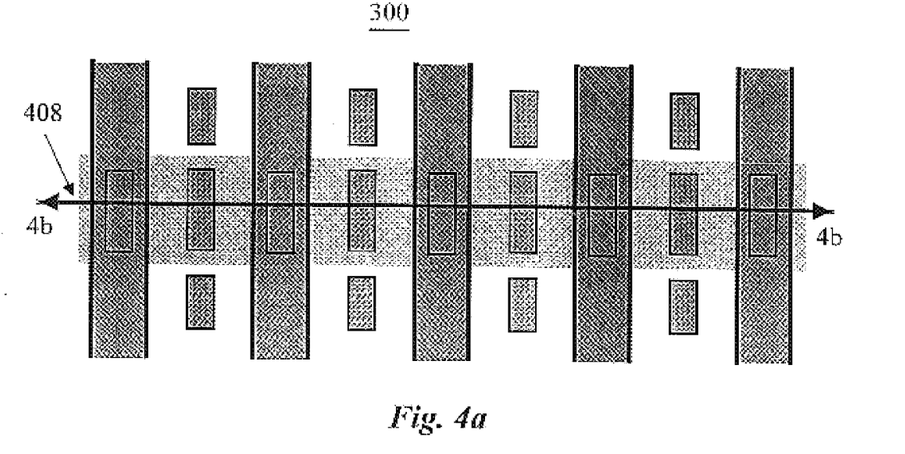
FIG. 4a represents a plan view of a portion of the transistor array illustrated in FIG. 3.
Figure 4B:
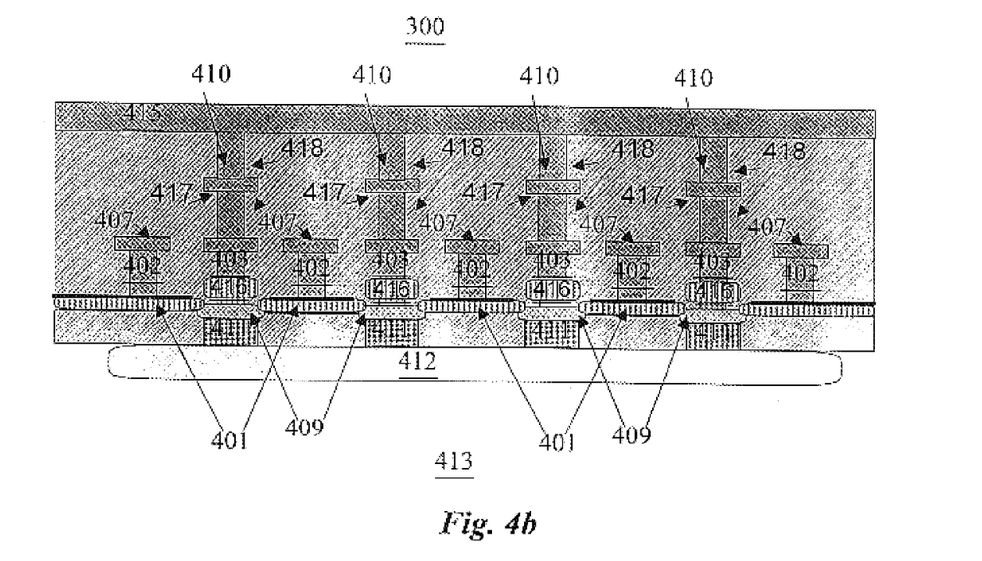

FIG. 4a illustrates a plan view of a portion of the embodiment of the transistor array in FIG. 3. In particular, FIG. 4a represents one row 408 of the transistor array 300. FIG. 4b shows a cross-sectional view of the row of the transistor array shown in FIG. 4a taken along the line 4b—4b.

This cross-sectional view, FIG. 4b, illustrates, for reference, a typical arrangement of layers in a double polysilicon self-aligned bipolar transistor. As can be seen in FIG. 4b, the present invention may include a buried layer subcollector 412. The subcollector 412 may be located in a wafer substrate 413. The subcollector 412 may be an N+region. The subcollector 412 may be included to link the collector reach through (sinker) to the intrinsic base regions 409 through a collector pedestal 411 of N-type material. The intrinsic semiconductor base 409 may be arranged between the collector pedestal 411 and the emitter polysilicon 416 layer. Connection to the intrinsic base region 409 may be made through a silicided polysilicon base 401. Interconnect metallization may be connected to the base and emitter through studs 402 and 403, respectively. As with studs 410 and 419, studs 402 and 403 typically are made of tungsten.

As shown in FIG. 4b, a transistor array according to the present invention may include a plurality of emitter regions 416. The emitter regions 416 may be polycrystalline silicon. An emitter contact 403 overlies each emitter region 416. The emitter contacts may be made of any electrically conducting material. However, the present invention typically includes tungsten emitter contacts. Advantages of tungsten as emitter contacts and in other applications within the structure according to the present invention are described below in greater detail.

As with the base contacts, the emitter contacts may be electrically connected by emitter contact interconnects 415 of electrically conductive material. Typically, the emitter contact interconnects are strips of last metal (LM) 415. These LM emitter contact interconnects 415 may run the entire width of the row. Thus, the emitter contact interconnects may electrically join all emitter contacts 403. Each emitter contact interconnect may join a different set of emitter contacts.

The emitter contact interconnects 415 may be joined at the left and/or right of the array to provide an LM connection (not shown) between them. Along these lines, the present invention may include at least one region of electrically conductive material electrically connecting together the plurality of emitter contact interconnects.

As illustrated in FIG. 4b, the present invention may include stacked studs 410 overlying the emitter contact interconnects 415. The via connections or stacked studs 410 may provide individual ballast resistors for providing protection from second breakdown. The stacked studs 410 are constructed of interconnect metallization 407, 417, and 415 and interlevel via metallization 418. The stacked stud 410 is arranged such that the current must flow vertically from the highest level of interconnect metallization down through the stacked stud to reach the emitter.

Any suitable electrically connecting material may be used in the via connections 410. For example, one or more metals and/or alloys may; be utilized. Some metal(s) may have particular characteristics that provide advantages over other metal(s).

For example, typically, the interlevel via connections in the stacked studs are composed of tungsten and the interconnect metallization is composed of aluminum. Tungsten has a relatively high series resistance in relation to the aluminum typically utilized in the interconnect 407, 415 and 417. For example, tungsten has a series resistance of about 0.4 $\Omega$-$\mu$m as compared to about 0.01 to about 0.20 $\Omega$-$\mu$m for aluminum. This series resistance can be used to achieve a small amount of emitter ballasting through the tungsten via connections used to connect to the emitter. This ballasting of the emitter provides a more thermally stable transistor when used in power applications.

If the emitter metallization is brought into the transistor array on the highest available interconnect level, the number of tungsten vies in series with the emitter may be maximized. Additionally, the tungsten used in the inter-level via connections is not prone to electromigration as is the aluminum interconnect. Thus, a wide, low resistance, emitter connection at the highest available interconnect level can be used to minimize the non-uniform distribution of current from emitter to emitter. At the same time, advantage may be taken of the equal series resistance, provided by the tungsten vias in series with each emitter to provide thermal stability through emitter ballasting.

In this embodiment of the invention three interconnect layers are shown, M1 407, M2 417 and M3 415. Any number of interconnect layers can be used from two on up, without materially altering the intent of the present invention. The composition of the interconnection layers is discussed above in greater detail.

Figure 5A:
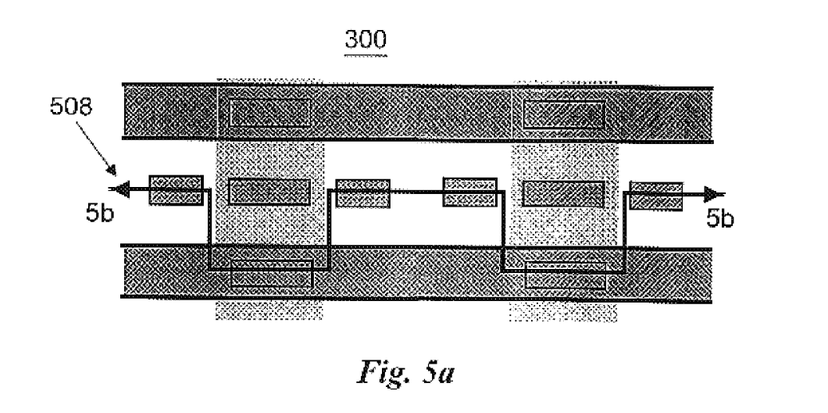
FIG. 5a represents a plan view of a portion of the transistor array illustrated in FIG. 3.
Figure 5B:
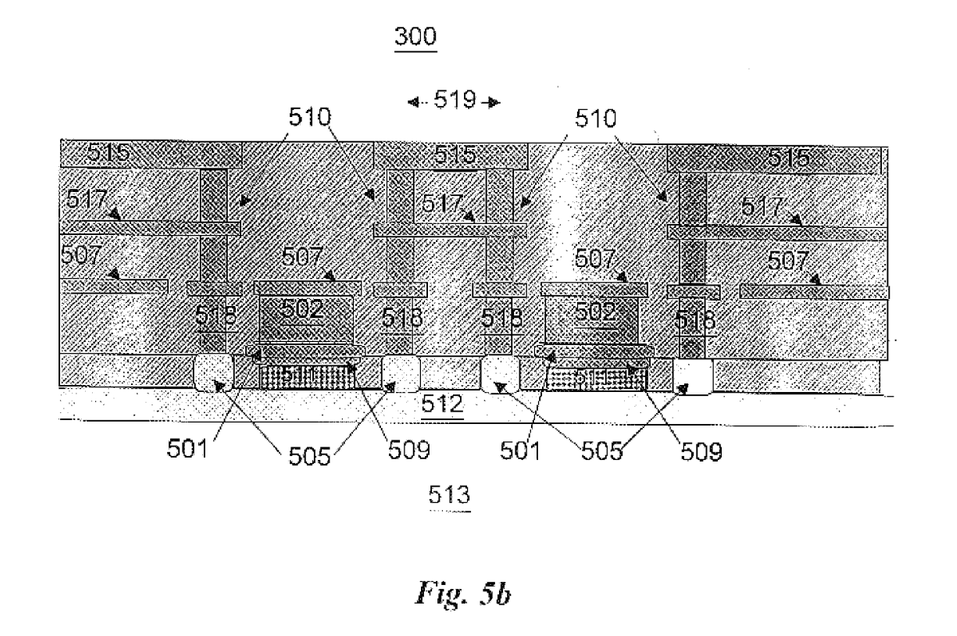

FIGS. 5a and 5b represent, respectively, plan and cross-sectional views of a column of the transistor array 300 illustrated in FIG. 3. However, for the sake of clarity, FIGS. 5a and 5b only show two unit cells of the transistor array. FIG. 5a is a plan view of the column 508 of unit cells. The bold line 5b—5b shows the position of the cross-sectional cut made to obtain the cross-sectional view represented in FIG. 5b. The emitter metallization and contact structure is not shown for clarity.

FIG. 5b shows for reference the typical arrangement of layers in a double polysilicon self-aligned bipolar transistor. The buried layer subcollector 512 may be located in a wafer substrate 513. The subcollector 512 may link to the intrinsic base region 509 through a collector pedestal 511 of N-type material.

Connection to the intrinsic base region 509 may be made through a silicided polysilicon base 501. In this embodiment of the invention three interconnect layers are shown: M1 507, M2 517, and M3 515. Three interconnect levels may be provide better power distribution which could enhance reliability characteristics. However, any number of interconnect layers can be used from two on up, without materially altering the intent of the present invention. Interconnect metallization may be connected to the base region and collector region through studs 502 and 518, respectively.

Also, the collectors may be connected to the upper metallization levels through a stack of tungsten studs 510. As with the other studs described above, any electrically conducting material may be utilized in the studs 502, 510, and 518. However, according to the present invention, typically, the studs are made of tungsten.

The common base bus at M1 507 is not shown in front of the collector contact stacks 510 for clarity. In actual practice the base bus 507 typically would extend unbroken from left to right across the view of FIG. 5b.

The spacing between unit cells in a column 519 may be dictated, at least in part, by the width of metallization required to provide current down the collector bus. Typically, the spacing is sufficient to satisfy electromigration guidelines and to reduce parasitic resistance in the collector.

The unit cell according to the present invention may utilize a double polysilicon self-aligned silicided base bipolar transistor. The proposed invention may also utilize multilevel aluminum interconnect technology typically available in silicon bipolar and BiCMOS processes. For the purposes of comparison, Table 1 provides a comparison of Ft, Fmax, and Rbb measurements for a prior art transistor, such as that illustrated in FIG. 1 and a transistor according to the present invention.

TABLE 1

| Parameter | Prior Art | Present Invention |
|---|---|---|
| Ft | 48 GHz | 46 GHz |
| Fmax | 65 GHz | 55 GHz |
| Rbb/unit emitter area@ constant Jc | 5.1 Ω | 3.9 Ω |

The present invention also includes methods for forming a transistor array including a plurality of transistors. The array may be formed in a matrix, such as a row and column matrix. The method includes providing an emitter region for each transistor. The emitter regions may be formed or otherwise provided in the dimensions and ratios of dimensions described above. An emitter region contact is provided overlying each emitter region.

At least one base region is provided underlying each emitter region and common to a plurality of transistors in the array. At least one base contact is provided overlying the at least one base region and associated with each transistor. The base contacts are provided such that a plurality of the base contacts are common to at least two transistors in the array.

At least one collector reach through is provided associated with each transistor. A collector reach through contact is provided overlying each collector reach through. A buried layer subcollector region of electrically conducting material electrically connects the collector reach through (sinker) region to the collector pedestal region of each transistor.

In commencing the methods, a substrate may be provided, a portion of which may have a buried layer subcollector formed on it. A plurality of collector pedestals may be provided on the buried layer subcollector. At least one base region may be provided on the collector pedestals. The base region may include an intrinsic monocrystalline semiconductor base region overlying each collector pedestal, and a silicided base region common to a plurality of the transistors. An emitter region is provided overlying each intrinsic base region. An emitter contact region is provided overlying each emitter region. At least one collector reach through is provided associated with each transistor. A collector reach through contact is provided overlying each collector reach through. At least one base contact is provided overlying the silicided base region and associated with each transistor, such that a plurality of the base contacts are common to at least two transistors in the array.

Base contact interconnects and emitter contact interconnects may be formed in configurations described above to electrically connect different groups of the base contacts and the emitter contacts. Studs, or via connections, may be provided to electrically connect the interconnections with the base contacts or emitter contacts. At least one region of electrically conducting material may be provided for electrically connecting the base contact interconnections and/or emitter contact interconnections.

A plurality of emitter ballast resistors, such as the studs or via connections described above, may be provided. One emitter ballast resistor may be provided for each emitter.

Deep trenches may be provided to isolate the transistor array from other adjacent devices. The present invention is particularly useful in high frequency applications, such as on the order of greater than about 1 Ghz. Also, the present invention may be particularly useful in applications that require low noise and/or high power devices for amplifiers, mixers, voltage controlled oscillators, and any other applications for components typically required in communication applications, particularly where the devices can be integrated with other analog/digital functions. Embodiments of the present invention have provided a base resistance/unit emitter area that is about fifty percent of the value for a comparable layout including long emitter fingers such as that illustrated in FIG. 1. The present invention also provides lower noise performance than previously achieved by bipolar devices in the high frequency domain. This lower noise has been achieved at least in part by reducing the base resistance per unit of emitter area.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A transistor array including a plurality of transistors, comprising:
    an emitter region for each transistor;
    an emitter region contact overlying each emitter region;
    at least one base region having an intrinsic and extrinsic base regions underlying each emitter region and common to a plurality of transistors in the array;
    a plurality of base contacts overlying the at least one base region,
    each of said base contacts being connected to a different portion of said base region common to a pair of said transistors, whereby each pair of said transistors has a different base contact;
    at least one collector reach through associated with each transistor;
    a collector reach through contact overlying each collector reach through;
    a collector pedestal associated with each transistor; and
    a buried layer subcollector region of electrically conducting material electrically connecting the collector reach through region to the collector pedestal region of each transistor.

2. The transistor array according to claim 1, wherein the extrinsic base region electrically connects the base contacts of a plurality of the transistors, providing a conductive pathway for base current from the base contacts to the intrinsic base region underlying the emitter.

3. The transistor array according to claim 2, further comprising:
    at least one base contact interconnect of electrically conductive material overlying and electrically joining a plurality of the base contacts.

4. The transistor array according to claim 3, further comprising:
    a plurality of electrically conducting studs for electrically connecting the base contact interconnects with the base contacts.

5. The transistor array according to claim 4, wherein the studs include tungsten.

6. The transistor array according to claim 3, further comprising:
    a plurality of electrically conducting studs for electrically connecting the emitter contact interconnects with the emitter contacts.

7. The transistor array according to claim 6, further comprising:
    a plurality of emitter ballast resistors, one associated with each electrically conducting stud between the emitter contact metallization and the emitter contact interconnects.

8. The transistor array according to claim 7, wherein the studs include tungsten.

9. The transistor array according to claim 7, wherein the interconnects include aluminum.

10. The transistor array according to claim 6, wherein the studs include tungsten.

11. The transistor array according to claim 6, wherein the interconnects include aluminum.

12. The transistor array according to claim 2, further comprising:
    a plurality of base contact interconnects of electrically conductive material overlying and electrically joining a plurality of the base contacts, each base contact interconnect contacting a different set of base contacts; and
    at least one region of electrically conductive material electrically connecting together the plurality of base contact interconnects.

13. The transistor array according to claim 12, wherein the interconnects include aluminum.

14. The transistor array according to claim 12, wherein the interconnects include aluminum.

15. The transistor array according to claim 2, further comprising:
    a plurality of base regions underlying a plurality of emitters and common to a plurality of transistors in the array, each base region being common to a different set of transistors.

16. The transistor array according to claim 2, further comprising:
    at least one emitter contact interconnect of electrically conductive material overlying and electrically joining a plurality of the emitter contacts.

17. The transistor array according to claim 2, further comprising:
    a plurality of emitter contact interconnects of electrically conductive material overlying and electrically joining a plurality of the emitter contacts, each emitter contact interconnect contacting a different set of emitter contacts; and
    at least one region of electrically conductive material electrically connecting together the plurality of emitter contact interconnects.

18. The transistor array according to claim 17, wherein the interconnects include aluminum.

19. The transistor array according to claim 1, wherein the subcollector is arranged in a substrate that the transistor array is formed on.

20. The transistor array according to claim 19, further comprising:
    a plurality of collector pedestals overlying the buried layer subcollector and underlying an associated emitter region such that the subcollector provides a common electrical connection to a plurality of the collector pedestals in the array; and
    an intrinsic base region overlying each collector pedestal and underlying the associated emitter region.

21. The transistor array according to claim 20, wherein an intrinsic base region is arranged between each collector pedestal and each emitter region.

22. The transistor array according to claim 1, wherein a length to width aspect ratio of emitter region of each transistor is about 1:1 to about 5:1.

23. The transistor array according to claim 1, wherein the array is arranged in a row-column matrix.

24. The transistor array according to claim 1, wherein the base region includes silicided polycrystalline silicon.

25. The transistor array according to claim 1, wherein the base region surrounds the emitter region.

26. The transistor array according to claim 1, wherein the collector reach throughs provide an ohmic contact to the buried layer subcollector region.

27. The transistor ray according to claim 1, wherein the base region is monocrystalline silicon.

* * * * *